(12) United States Patent
Ma et al.

(10) Patent No.: US 11,164,747 B2
(45) Date of Patent: Nov. 2, 2021

(54) GROUP III-V SEMICONDUCTOR DEVICES HAVING ASYMMETRIC SOURCE AND DRAIN STRUCTURES

(71) Applicant: Intel Corporation, Santa Clara, CA (US)

(72) Inventors: Sean T. Ma, Portland, OR (US); Gilbert Dewey, Hillsboro, OR (US); Willy Rachmady, Beaverton, OR (US); Harold W. Kennel, Portland, OR (US); Cheng-Ying Huang, Hillsboro, OR (US); Matthew V. Metz, Portland, OR (US); Nicholas G. Minutillo, Beaverton, OR (US); Jack T. Kavalieros, Portland, OR (US); Anand S. Murthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/629,550

(22) PCT Filed: Sep. 28, 2017

(86) PCT No.: PCT/US2017/054193
§ 371 (c)(1),
(2) Date: Jan. 8, 2020

(87) PCT Pub. No.: WO2019/066880
PCT Pub. Date: Apr. 4, 2019

(65) Prior Publication Data
US 2020/0203169 A1 Jun. 25, 2020

(51) Int. Cl.
*H01L 21/285* (2006.01)
*H01L 29/10* (2006.01)
(Continued)

(52) U.S. Cl.
CPC .... *H01L 21/28575* (2013.01); *H01L 29/1045* (2013.01); *H01L 29/205* (2013.01);
(Continued)

(58) Field of Classification Search
CPC .......................... H01L 21/28575; H01L 29/78
See application file for complete search history.

(56) References Cited

U.S. PATENT DOCUMENTS

| | | | |
|---|---|---|---|
| 5,081,511 A | * | 1/1992 | Tehrani .................. B82Y 10/00 257/192 |
| 9,123,741 B2 | | 9/2015 | Lau et al. |
| 9,461,159 B1 | | 10/2016 | Chou et al. |
| 10,170,332 B2 | | 1/2019 | Huang |

(Continued)

FOREIGN PATENT DOCUMENTS

| | | |
|---|---|---|
| KR | 10-2016-0114010 | 10/2016 |
| WO | WO 2017/052618 | 3/2017 |

OTHER PUBLICATIONS

Jiongjiong Mo et al, Asymmetric InGaAs/InP MOSFETs With Source/Drain Engineering, May 2014, IEEE Electron Device Letters, vol. 35, Issue 5, pp. 515-517 (Year: 2014).*

(Continued)

*Primary Examiner* — Changhyun Yi
(74) *Attorney, Agent, or Firm* — Schwabe, Williamson & Wyatt, P.C.

(57) ABSTRACT

Group III-V semiconductor devices having asymmetric source and drain structures and their methods of fabrication are described. In an example, an integrated circuit structure includes a gallium arsenide layer on a substrate. A channel structure is on the gallium arsenide layer. The channel structure includes indium, gallium and arsenic. A source structure is at a first end of the channel structure and a drain structure is at a second end of the channel structure. The drain structure has a wider band gap than the source structure. A gate structure is over the channel structure.

20 Claims, 11 Drawing Sheets

(51) Int. Cl.
  *H01L 29/205* (2006.01)
  *H01L 29/66* (2006.01)
  *H01L 29/739* (2006.01)
  *H01L 29/775* (2006.01)
  *H01L 29/778* (2006.01)
  *H01L 29/78* (2006.01)

(52) U.S. Cl.
  CPC .. *H01L 29/66522* (2013.01); *H01L 29/66636* (2013.01); *H01L 29/66659* (2013.01); *H01L 29/66795* (2013.01); *H01L 29/7391* (2013.01); *H01L 29/775* (2013.01); *H01L 29/7787* (2013.01); *H01L 29/785* (2013.01)

(56) References Cited

U.S. PATENT DOCUMENTS

| | | | |
|---|---|---|---|
| 2015/0200288 A1* | 7/2015 | Zhang | H01L 29/7376 257/12 |
| 2017/0018640 A1 | 1/2017 | Then et al. | |
| 2017/0047404 A1 | 2/2017 | Bentley | |
| 2017/0271499 A1 | 9/2017 | Lee | |
| 2018/0342428 A1* | 11/2018 | Leobandung | H01L 21/8258 |

OTHER PUBLICATIONS

International Search Report and Written Opinion for International Patent Application No. PCT/US2017/054193 dated Jun. 28, 2018, 14 pgs.
International Preliminary Report on Patentability for International Patent Application No. PCT/US2017/054193, dated Apr. 9, 2020, 9 pgs.
Search Report from European Patent Application No., dated Mar. 23, 2021, 16 pgs.
Mo Jiongjiong et al: "Reduction of off-state drain leakage in InGaAs-based metal-oxide-semiconductor field-effect transistors", Applied Physics Letters, A I P Publishing LLC, US, vol. 105, No. 3, Jul. 21, 2014 (Jul. 21, 2014), XP012189189, ISSN: 0003-6951, DOI: 10.1063/1.4891569.
Mo Jiongjiong et al: 11 InP Drain Engineering in Asymmetric InGaAs/InP MOSFETs, IEEE Transactions on Electron Devices, IEEE Service Center, Piscataway, NJ, US, vol. 62, No. 2, Feb. 1, 2015 (Feb. 1, 2015), pp. 501-506, XP011570671, ISSN: 0018-9383, DOI: 10.1109/TED.2014.2375913.
Extended Search Report from European Patent Application No. 17927407.1, dated Jun. 24, 2021, 14 pgs.

* cited by examiner

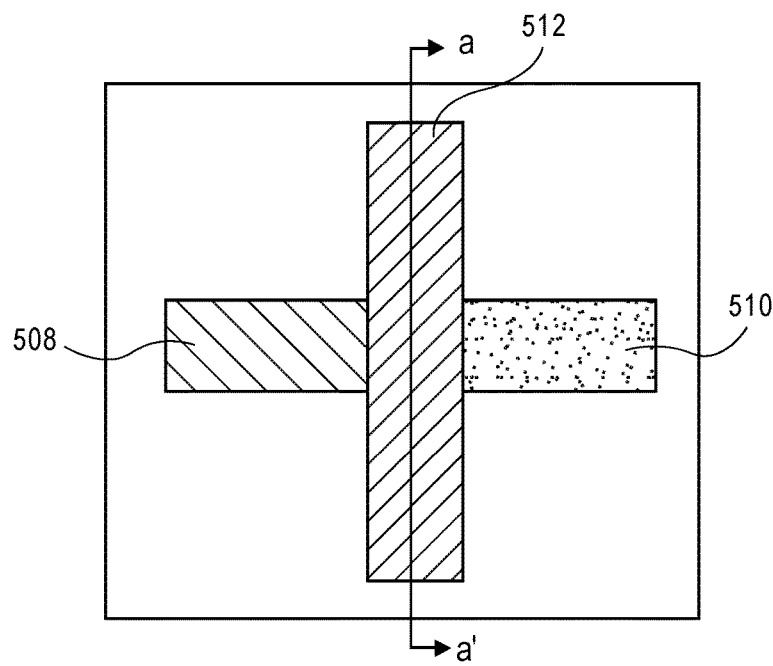
FIG. 5A
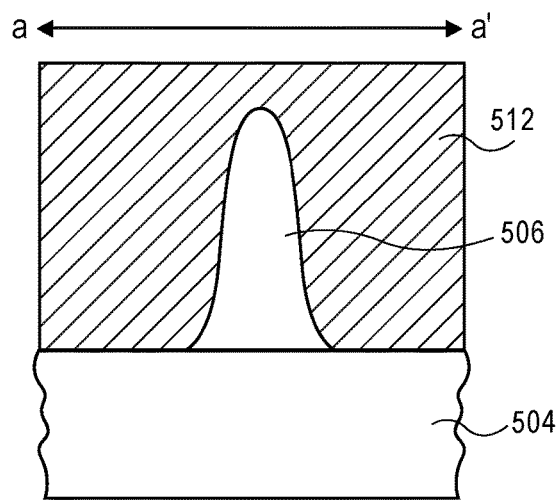 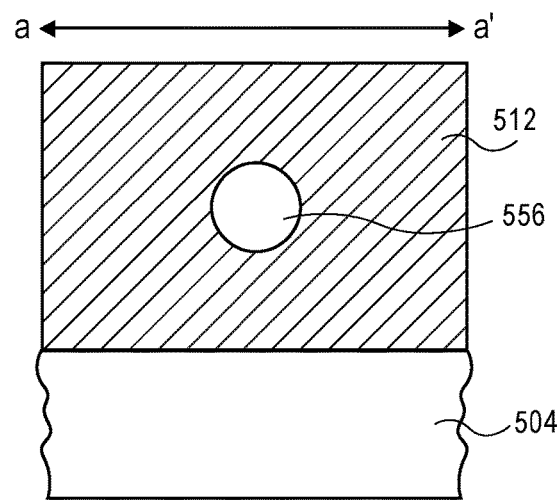
FIG. 5B  FIG. 5C

GROUP III-V SEMICONDUCTOR DEVICES HAVING ASYMMETRIC SOURCE AND DRAIN STRUCTURES

CROSS-REFERENCE TO RELATED APPLICATION

This patent application is a U.S. National Phase Application under 35 U.S.C. § 371 of International Application No. PCT/US2017/054193, filed Sep. 28, 2017, entitled "GROUP III-V SEMICONDUCTOR DEVICES HAVING ASYMMETRIC SOURCE AND DRAIN STRUCTURES," which designates the United States of America, the entire disclosure of which is hereby incorporated by reference in its entirety and for all purposes.

TECHNICAL FIELD

Embodiments of the present disclosure relate to semiconductor integrated circuits and more particularly to group III-V semiconductor devices having asymmetric source and drain structures, and their methods of fabrication.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

As the dimensions of fundamental building blocks of microelectronic circuitry are reduced and as the sheer number of fundamental building blocks fabricated in a given region is increased, the constraints on the semiconductor processes used to fabricate these building blocks have become overwhelming. In particular, there may be a trade-off between the smallest dimension of a feature patterned in a semiconductor stack (the critical dimension) and the spacing between such features.

Variability in conventional and state-of-the-art fabrication processes may limit the possibility to further extend them into the, e.g. 10 nm or sub-10 nm range. Consequently, fabrication of the functional components needed for future technology nodes may require the introduction of new methodologies or the integration of new technologies in current fabrication processes or in place of current fabrication processes.

BRIEF DESCRIPTION OF THE DRAWINGS

FIG. 5A illustrates a plan view of a group III-V semiconductor device having asymmetric source and drain structures, in accordance with an embodiment of the present disclosure.

FIG. 5B illustrates a cross-sectional view of a fin-based group III-V semiconductor device having asymmetric source and drain structures, in accordance with an embodiment of the present disclosure.

FIG. 5C illustrates a cross-sectional view of a nanowire-based group III-V semiconductor device having asymmetric source and drain structures, in accordance with an embodiment of the present disclosure.

DESCRIPTION OF THE EMBODIMENTS

Figure 1A:
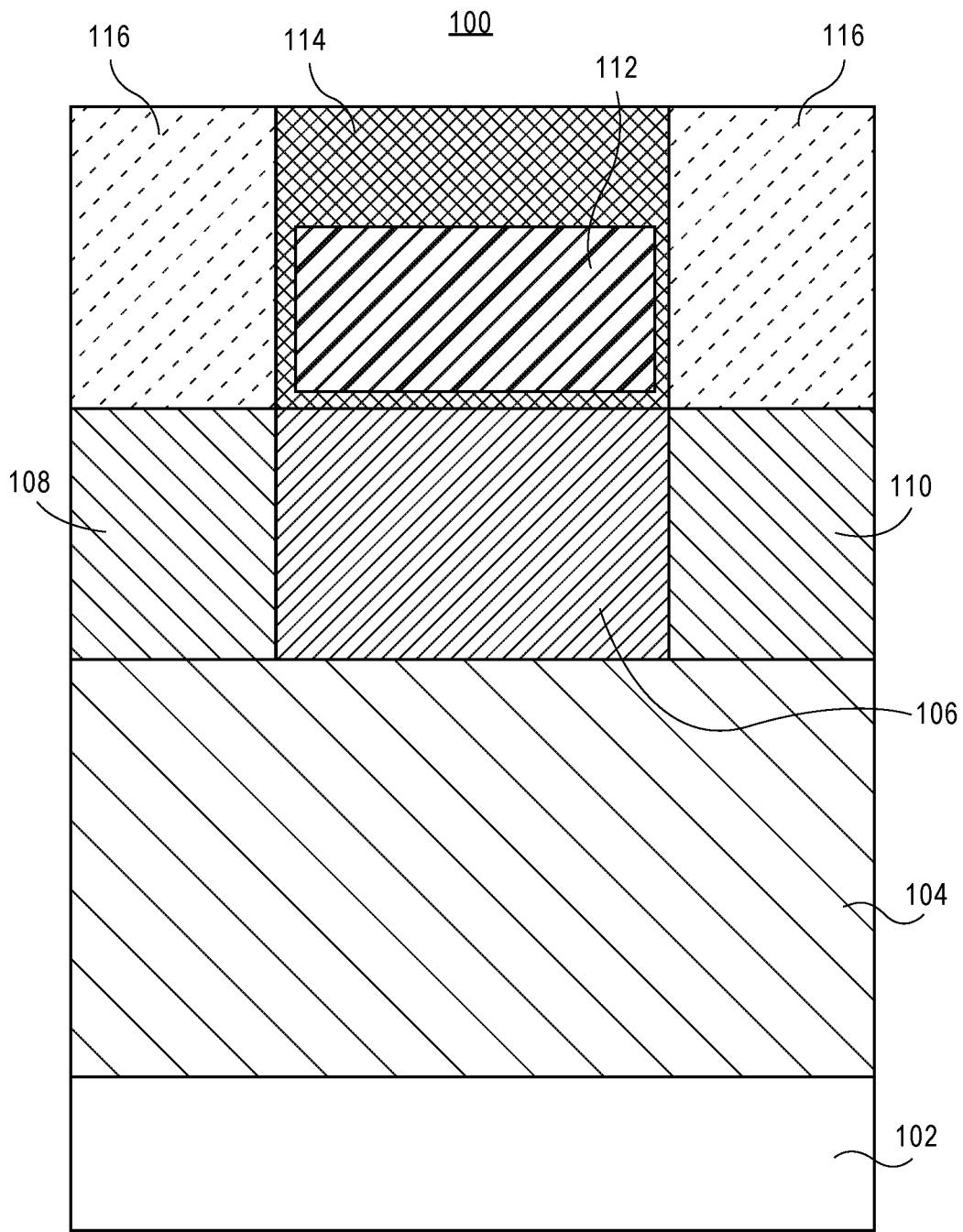
FIG. 1A illustrates a cross-sectional view of a conventional group III-V semiconductor device.

Group III-V semiconductor devices having asymmetric source and drain structures and their methods of fabrication are described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side"

describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

Embodiments of the present disclosure are directed to complementary metal oxide semiconductor (CMOS) devices with asymmetric source ad drain structures for band to band tunneling (BTBT) reduction. Particular embodiments are directed to III-V semiconductor based transistor fabrication, such as devices based on indium gallium arsenide (InGaAs) channel structures on gallium arsenide (GaAs) layers or substrates. Embodiments may be implemented to address elevated off-state leakage problems associated with narrow bandgap (NBG) channel materials due to band-to-band tunneling (BTBT) and BTBT induced floating body barrier lowering (BIBL) in field effect transistors (FETs). The narrow bandgap channel materials include but are not limited to group III-V semiconductor materials such as InGaAs and InAs, and group IV semiconductor materials such as Ge.

In accordance with one or more embodiments of the present disclosure, an integrated circuit structure includes wide band gap (WBG) material in a drain structure or region to reduce BTBT. Narrow band gap (NBG) material is included in a source structure or region to reduce floating charge (BTBT) induced barrier lowering (BIBL). Embodiments may be applicable to providing reduced leakage current and leakage power in chips fabricated from high mobility transistors such as those based III-V and Ge materials.

Figure 1B:
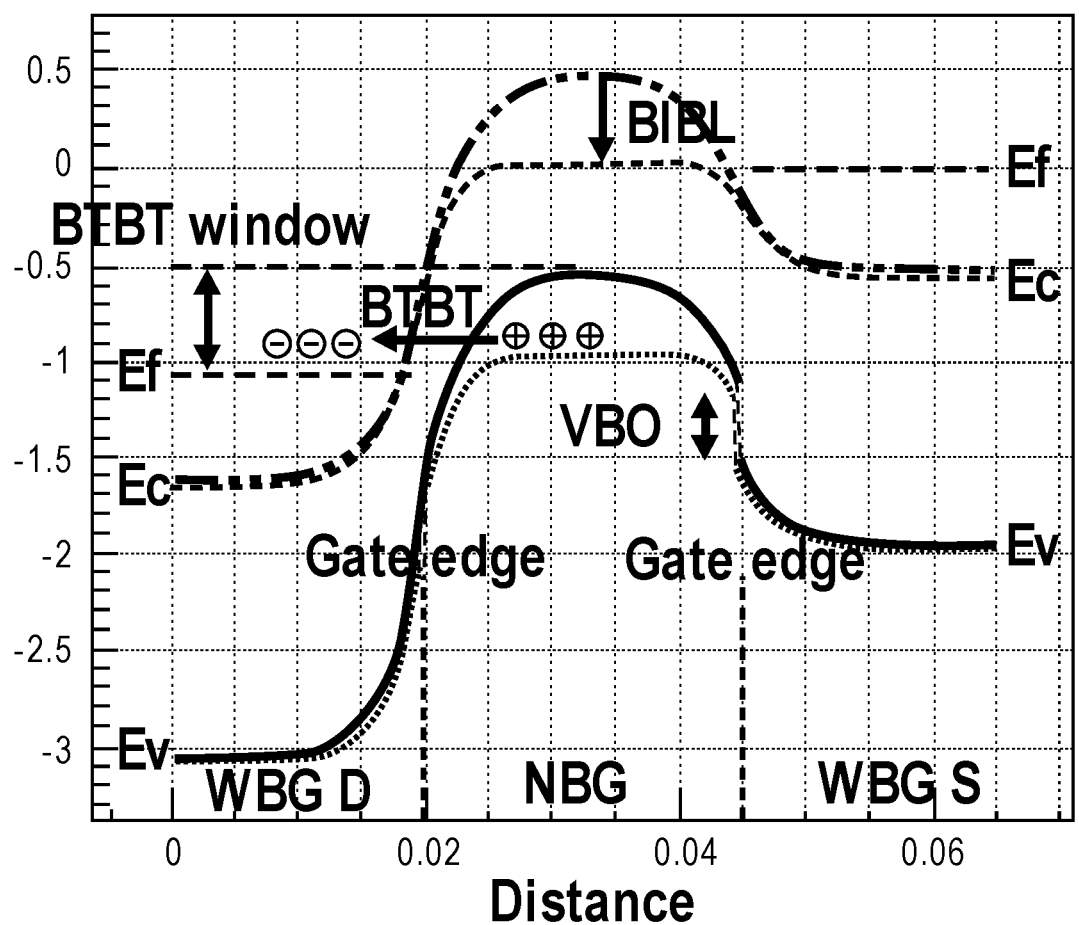
FIG. 1B is a plot showing band to band tunneling (BTBT) for the conventional group III-V semiconductor device of FIG. 1A.
Figure 1C:
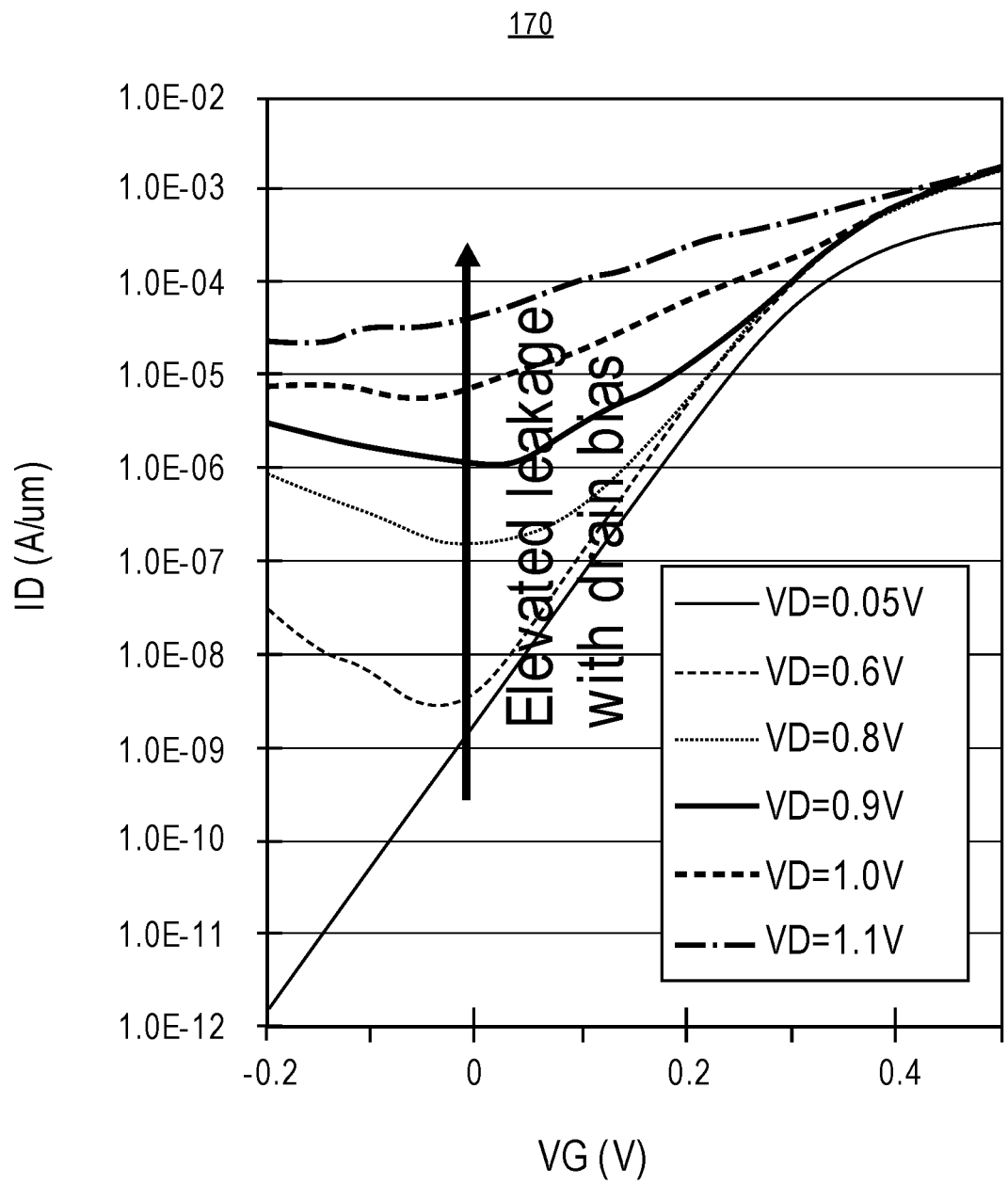
FIG. 1C is a plot of drain current (ID) as a function of gate voltage (VG) for the conventional group III-V semiconductor device of FIG. 1A.

To provide context, FIG. 1A illustrates a cross-sectional view of a conventional group III-V semiconductor device. FIG. 1B is a plot 150 showing band to band tunneling (BTBT) for the conventional group III-V semiconductor device of FIG. 1A. FIG. 1C is a plot 170 of drain current (ID) as a function of gate voltage (VG) for the conventional group III-V semiconductor device of FIG. 1A.

Referring to FIG. 1A, an integrated circuit structure 100 includes a gallium arsenide layer 104 on a substrate 102. An InGaAs channel structure 106 is on the gallium arsenide layer 104. A source structure 110 is at a first end of the channel structure 106, and a drain structure 108 is at a second end of the channel structure 106. The source structure 110 and the drain structure 108 have a substantially wider band gap than the channel structure 106. A gate structure including a gate electrode 112 and surrounding gate dielectric 114 is over the channel structure 106. Source and drain contact 116 are laterally adjacent the gate electrode 112. The source structure 106 and the drain structure 108 are composed of a same material and have a same doping concentration such as a same doping concentration of N-type dopants.

Referring to plot 150 of FIG. 1B, an issue with the state-of-the-art is that wide bandgap source and drain materials (110 and 108) are located in regions outside of the BTBT window. As a result there is no improvement or essentially no improvement in BTBT reduction. Referring to plot 170 of FIG. 1C, elevated leakage occurs as a function of drain bias.

By contrast, in accordance with one or more embodiments described herein, a delta band gap is implemented for corresponding source and drain structures to reduce not only band bending but also the BTBT window, reducing BTBT significantly. As an example, FIG. 2A illustrates a cross-sectional view of a group III-V semiconductor device having asymmetric source and drain structures, in accordance with an embodiment of the present disclosure.

Figure 2A:
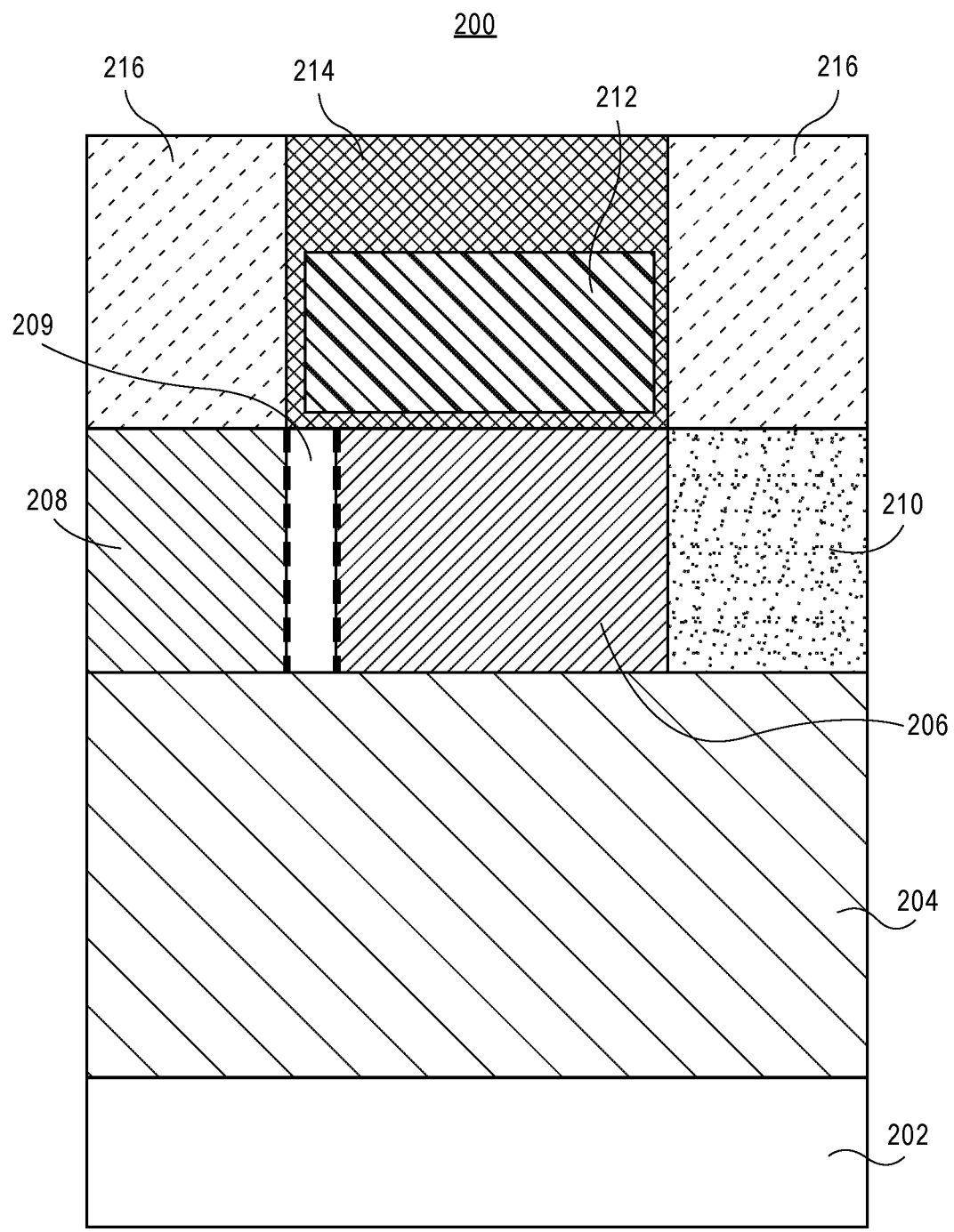
FIG. 2A illustrates a cross-sectional view of a group III-V semiconductor device having asymmetric source and drain structures, in accordance with an embodiment of the present disclosure.

Referring to FIG. 2A, an integrated circuit structure 200 includes a gallium arsenide (GaAs) layer 204 on a substrate 202, such as a silicon (Si) substrate. A channel structure 206 is on the gallium arsenide layer 204. In an embodiment, the channel structure 206 is a III-V material channel structure. In one embodiment, the channel structure 206 includes indium, gallium and arsenic (e.g., an InGaAs channel structure). A source structure 210 is at a first end of the channel structure 206 and a drain structure 208 is at a second end of the channel structure 206. A gate structure is over the channel structure 206. In an embodiment, the drain structure 208 has a wider band gap than the source structure 210.

In an embodiment, the source structure 210 has approximately the same band gap as the channel structure 206. In an embodiment, the drain structure 208 includes indium phosphide (InP), and the source structure 210 includes indium gallium arsenide (InGaAs) or indium arsenide (InAs).

In an embodiment, the source structure 210 and the drain structure 208 are doped with N-type dopants, such as silicon dopant atoms. In an embodiment, the concentration of N-type dopants in the drain structure 208 is less than the concentration of N-type dopants in the source structure 210. In a particular embodiment, the concentration of N-type dopants in the drain structure 208 is approximately 1E19, and the concentration of N-type dopants in the source structure 210 is approximately 5E19.

In an embodiment, the integrated circuit structure 200 further includes an intrinsic region 209 between the drain structure 208 and the channel structure 206. In a particular embodiment, the intrinsic region 209 includes a same semiconductor material as the drain structure 208.

In an embodiment, the gate structure 212 is an N-type gate electrode. In an embodiment, a dielectric layer 214 is between the channel structure 206 and the gate structure 212. In an embodiment, a first conductive contact (left 216) is on the drain structure 208 and adjacent a first side of the gate structure 212, and a second conductive contact (right 216) is on the source structure 210 and adjacent a second side of the gate structure 212.

In an embodiment, the channel structure 206 is a fin structure, as is described in greater detail below in association with FIG. 5B. In an embodiment, the channel structure 206 is a nanowire structure, as is described in greater detail below in association with FIG. 5C.

Figure 2B:
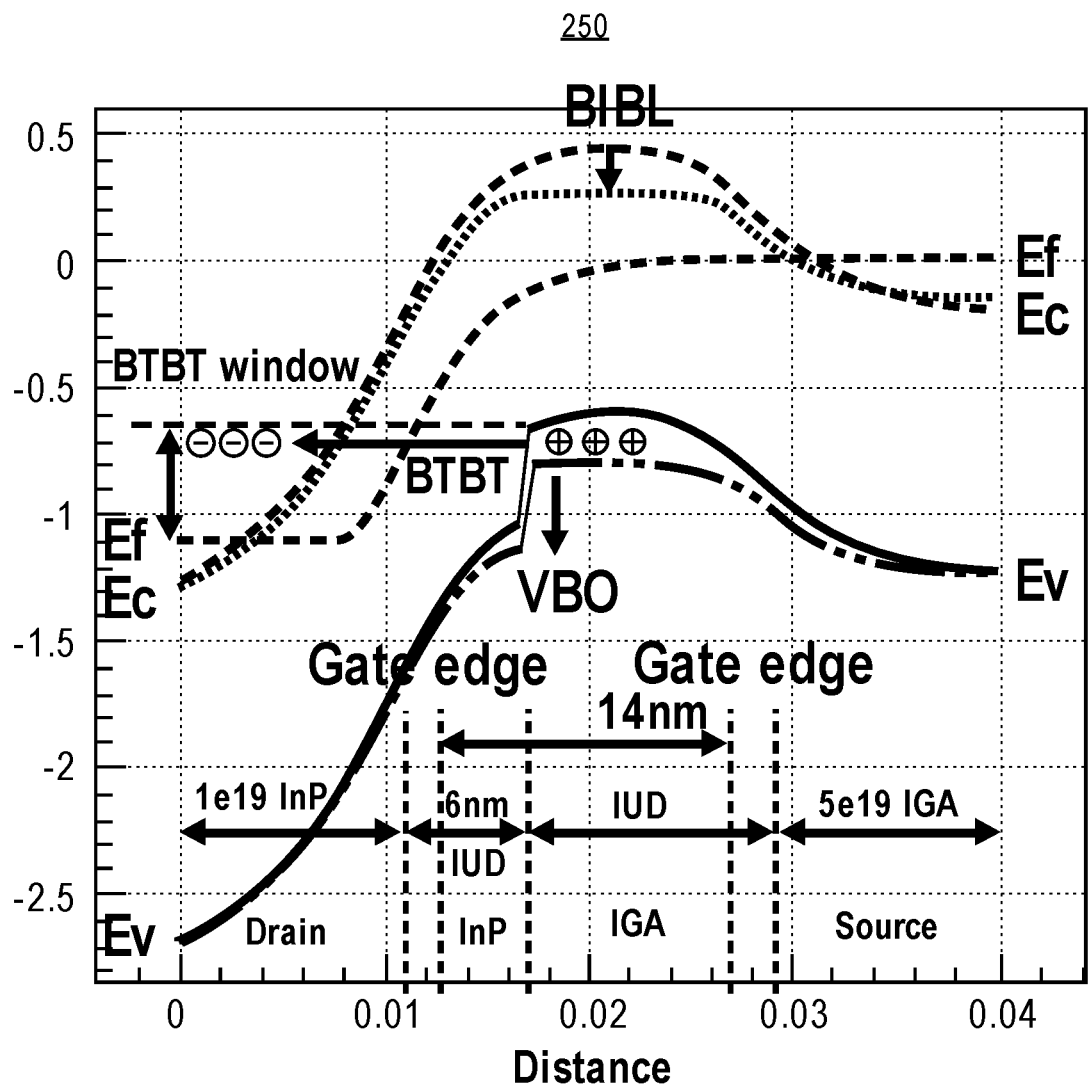
FIG. 2B is a plot showing band to band tunneling (BTBT) for the group III-V semiconductor device of FIG. 2A, in accordance with an embodiment of the present disclosure.

FIG. 2B is a plot 250 showing band to band tunneling (BTBT) for the group III-V semiconductor device of FIG. 2A, in accordance with an embodiment of the present disclosure. Referring to plot 250, in contrast to state-of-the-art device based on symmetric source and drain structures, asymmetric source and drain structures are implemented to reduce not only band bending but also the BTBT window, reducing BTBT significantly. In a particular embodiment, an undoped WBG material (e.g., 209 from FIG. 2A) is disposed on the drain side under the gate to contain the BTBT window in the high field region. In one embodiment, the WBG material 209 increases the tunneling width and, hence, reduces the BTBT rates.

Figure 2C:
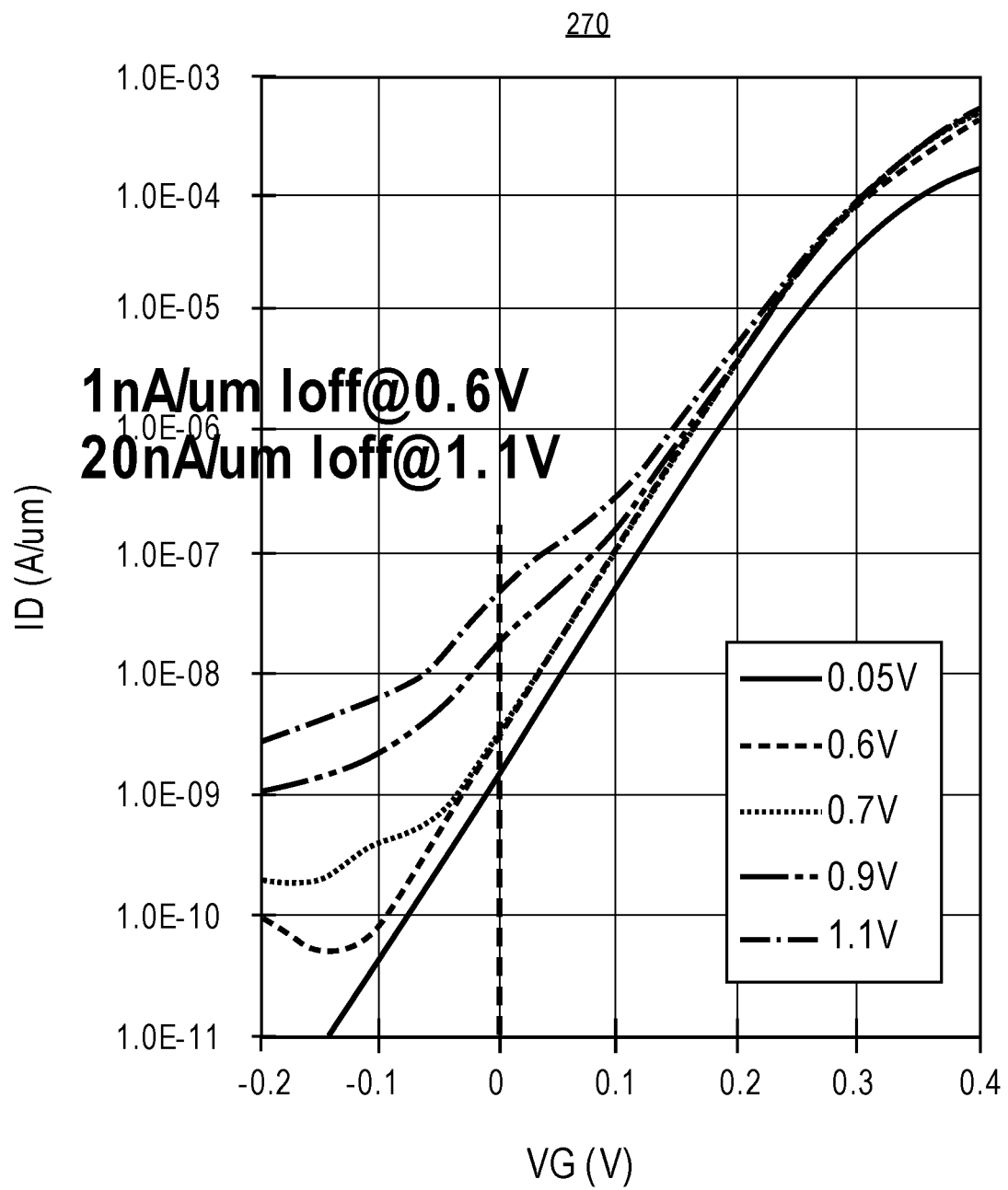
FIG. 2C is a plot of drain current (ID) as a function of gate voltage (VG) for the group III-V semiconductor device of FIG. 2A, in accordance with an embodiment of the present disclosure.

FIG. 2C is a plot 270 of drain current (ID) as a function of gate voltage (VG) for the group III-V semiconductor device of FIG. 2A, in accordance with an embodiment of the present disclosure. Referring to plot 270, leakage as a function of drain bias is reduced compared to the structure of FIG. 1A (e.g., as compared against the plot 170 of FIG. 1C). In one embodiment, the implementation of asymmetric source and drain structures reduces the BTBT and Ioff at high supply voltage by orders of magnitude compared to state-of-the-art devices.

Figure 3A:
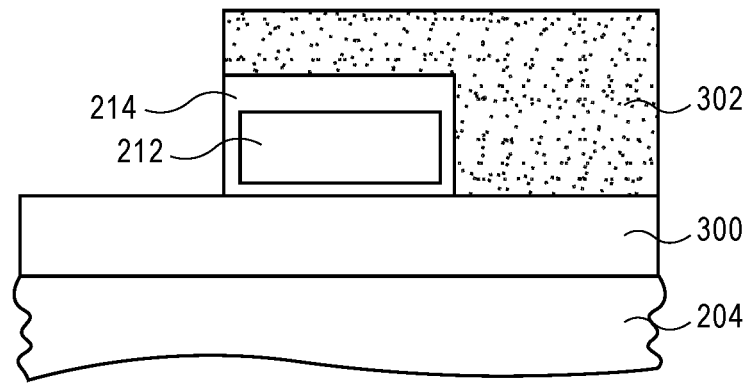
FIGS. 3A-3C illustrate cross-sectional views of various operations in a method of fabricating a group III-V semiconductor device having asymmetric source and drain structures, in accordance with an embodiment of the present disclosure.
Figure 3B:
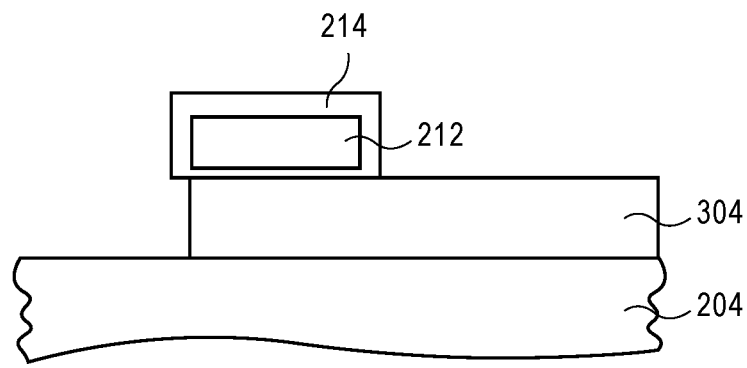
Figure 3C:
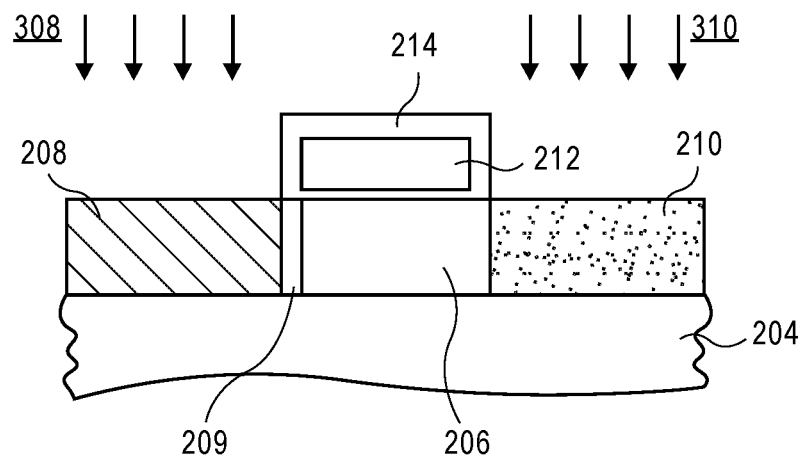

In a first exemplary processing scheme, FIGS. 3A-3C illustrate cross-sectional views of various operations in a method of fabricating a group III-V semiconductor device having asymmetric source and drain structures, in accordance with an embodiment of the present disclosure.

Referring to FIG. 3A, a method of fabricating an integrated circuit structure includes forming a first semiconductor layer 300 on a gallium arsenide layer 204 above a substrate or as a substrate. A gate structure 212/214 (e.g., a gate electrode 212 and dielectric layer 214) is formed over the first semiconductor layer 300. A second side of the gate structure (right side) but not a first side (left side) of the gate structure 212/214 is masked with a mask 302.

Referring to FIG. 3B, a portion of the first semiconductor layer 300 is removed at the first side of the gate structure 212/214. The removal provides patterned first semiconductor layer 304. The mask 302 is then removed.

Referring to FIG. 3C, a second semiconductor layer 208/209 is formed at the first side of the gate structure 212/214. In an embodiment, the second semiconductor layer 208/209 has a wider band gap than the first semiconductor layer 304. In an embodiment, N-type dopants are implanted 308 to form a drain structure 208 in the second semiconductor layer 208/209 at the first side of the gate structure 212/214. N-type dopants are also implanted 310 to form a source structure 210 in the first semiconductor layer 304 at the second side of the gate structure 212/214. The implant operations 308 and 310 may be performed in different operations to achieve differential doping between the drain structure 208 and 210.

In an embodiment, upon performing the implant operations 308 and 310, a channel structure 206 is defined. In an embodiment, the channel structure 206 is a fin structure, as is described in greater detail below in association with FIG. 5B. In another embodiment, the channel structure 206 is a nanowire structure, as is described in greater detail below in association with FIG. 5C. In an embodiment, upon performing the implant operations 308 and 310, an intrinsic region 209 is defined in the second semiconductor layer, as depicted in FIG. 3C.

In an embodiment, the first semiconductor layer 300/304 includes indium, gallium and arsenic. In an embodiment, the second semiconductor layer 208/209 includes indium and phosphorus. In an embodiment, a concentration of N-type dopants in the drain structure 208 is less than the concentration of N-type dopants in the source structure 210. In an embodiment, the method further includes forming a first conductive contact on the drain structure 208, and forming a second conductive contact on the source structure 210.

Figure 4A:
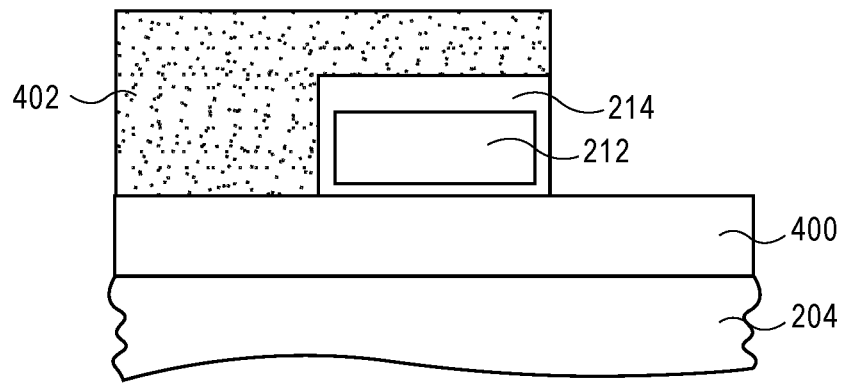
FIGS. 4A-4C illustrate cross-sectional views of various operations in another method of fabricating a group III-V semiconductor device having asymmetric source and drain structures, in accordance with an embodiment of the present disclosure.
Figure 4B:
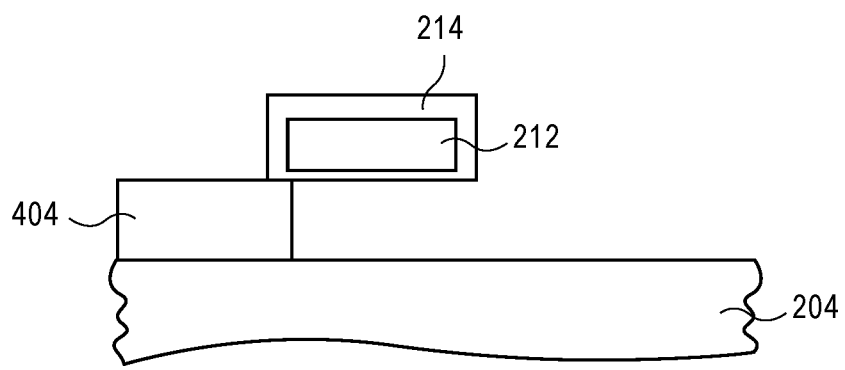
Figure 4C:
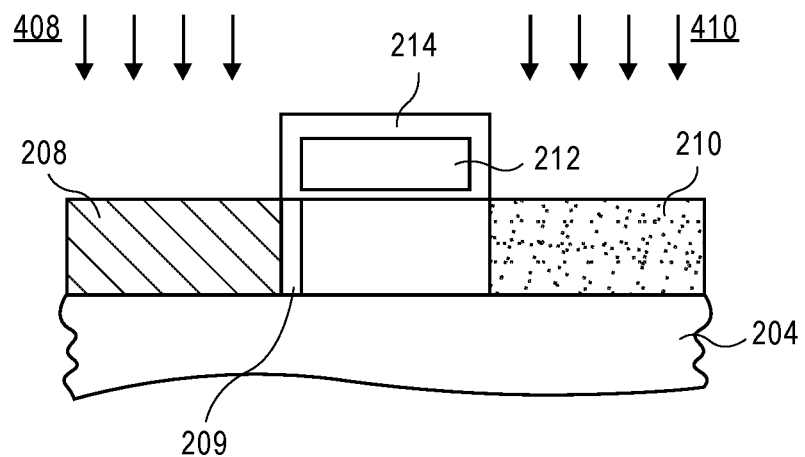

In a second exemplary processing scheme, FIGS. 4A-4C illustrate cross-sectional views of various operations in another method of fabricating a group III-V semiconductor device having asymmetric source and drain structures, in accordance with an embodiment of the present disclosure.

Referring to FIG. 4A, a method of fabricating an integrated circuit structure includes forming a first semiconductor layer 400 on a gallium arsenide layer 204 above a substrate or as a substrate. A gate structure 212/214 (e.g., a gate electrode 212 and dielectric layer 214) is formed over the first semiconductor layer 400. A first side of the gate structure (left side) but not a second side (right side) of the gate structure 212/214 is masked with a mask 402.

Referring to FIG. 4B, a portion of the first semiconductor layer 400 is removed at the second side of the gate structure 212/214. The removal provides patterned first semiconductor layer 404. The mask 402 is then removed.

Referring to FIG. 4C, a second semiconductor layer 206/210 is formed at the second side of the gate structure 212/214. In an embodiment, the first semiconductor layer 404 has a wider band gap than the second semiconductor layer 206/210. In an embodiment, N-type dopants are implanted 408 to form a drain structure 208 in the first semiconductor layer 400/404 at the first side of the gate structure 212/214. N-type dopants are also implanted 410 to form a source structure 210 in the second semiconductor layer 206/210 at the second side of the gate structure 212/214. The implant operations 408 and 410 may be performed in different operations to achieve differential doping between the drain structure 208 and 210.

In an embodiment, upon performing the implant operations 408 and 410, a channel structure 206 is defined. In an embodiment, the channel structure 206 is a fin structure, as is described in greater detail below in association with FIG. 5B. In another embodiment, the channel structure 206 is a nanowire structure, as is described in greater detail below in association with FIG. 5C. In an embodiment, upon performing the implant operations 408 and 410, an intrinsic region 209 is defined in the first semiconductor layer 400/404, as depicted in FIG. 4C.

In an embodiment, the second semiconductor layer 206/210 includes indium, gallium and arsenic. In an embodiment, the first semiconductor layer 400/404 includes indium and phosphorus. In an embodiment, a concentration of N-type dopants in the drain structure 208 is less than the concentration of N-type dopants in the source structure 210. In an embodiment, the method further includes forming a first conductive contact on the drain structure 208, and forming a second conductive contact on the source structure 210.

It is to be appreciated that a semiconductor channel structure as disclosed herein may be a planar channel structure or a non-planar channel structure. FIG. 5A illustrates a plan view of a group III-V semiconductor device having asymmetric source and drain structures in accordance with an embodiment of the present disclosure. It is to be appreciated that the plan view of FIG. 5A is applicable to both planar channel structure embodiments and non-planar channel structure embodiments.

Referring to FIG. 5A, an integrated circuit structure includes channel structure (covered) having a source structure 510 at a first end of the channel structure and a drain structure 508 is at a second end of the channel structure. A gate structure 512 is over the channel structure. In one embodiment, the source structure 510 and the drain structure 508 are asymmetric with respect to one another, exemplary embodiments of which are described above.

FIG. 5B illustrates a cross-sectional view of a fin-based group III-V semiconductor device having asymmetric source and drain structures, in accordance with an embodiment of the present disclosure.

Referring to FIG. 5B, a gallium arsenide (GaAs) substrate or layer 504, e.g., a layer on a silicon substrate, such as a silicon (Si) substrate, is provided. A fin channel structure 506 is on the gallium arsenide layer 504. In an embodiment, the fin channel structure 506 is a III-V material channel structure. In one embodiment, the fin channel structure 506 includes indium, gallium and arsenic (e.g., an InGaAs fin channel structure).

FIG. 5C illustrates a cross-sectional view of a nanowire-based group III-V semiconductor device having asymmetric source and drain structures, in accordance with an embodiment of the present disclosure.

Referring to FIG. 5C, a gallium arsenide (GaAs) substrate or layer 504, e.g., a layer on a silicon substrate, such as a silicon (Si) substrate, is provided. A nanowire channel structure 556 is on the gallium arsenide layer 504. In an embodiment, the nanowire channel structure 556 is a III-V material channel structure. In one embodiment, the nanowire channel structure 556 includes indium, gallium and arsenic (e.g., an InGaAs nanowire channel structure).

Implementations of embodiments of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 6:
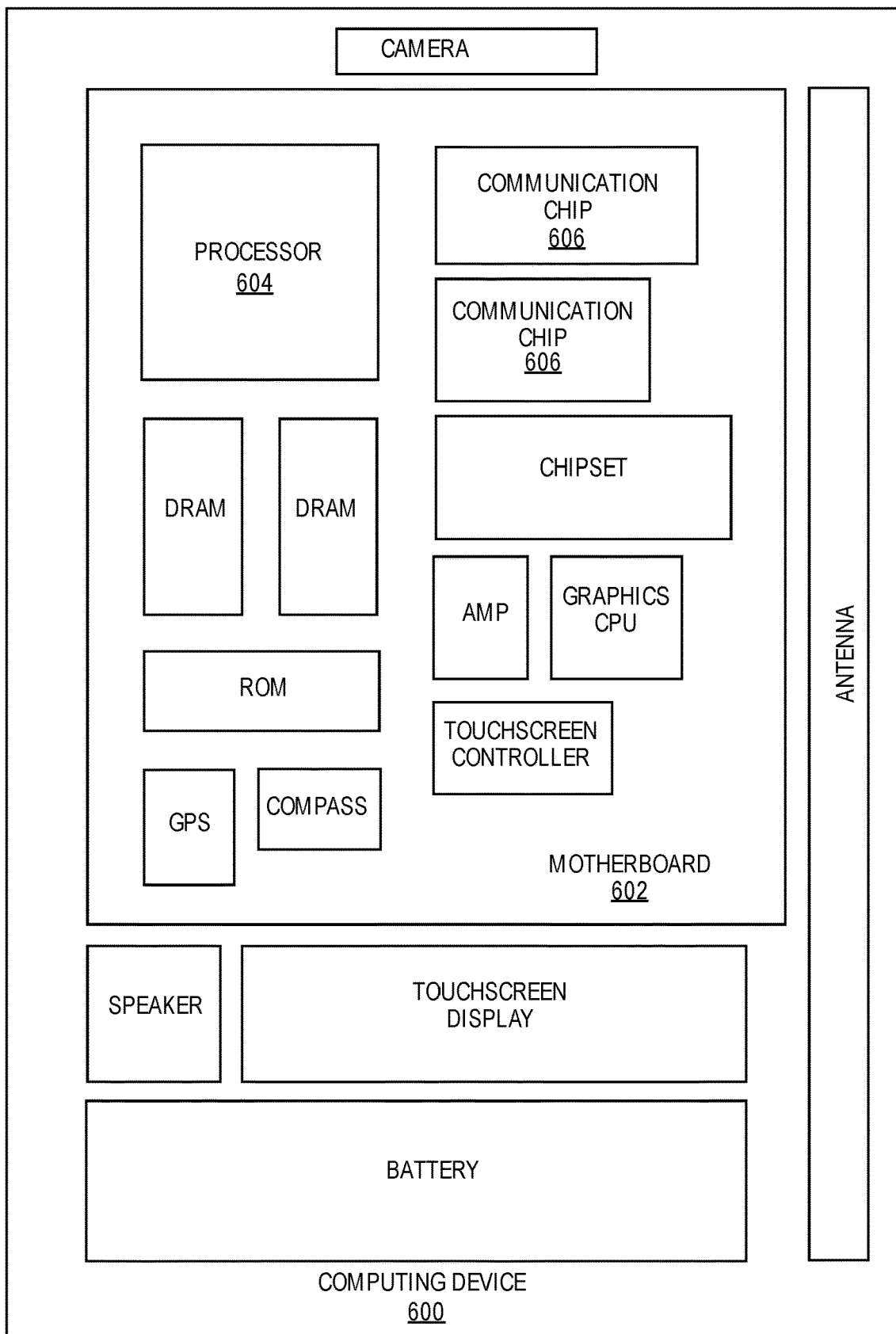
FIG. 6 illustrates a computing device in accordance with one implementation of the disclosure.

FIG. 6 illustrates a computing device 600 in accordance with one implementation of the disclosure. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the disclosure, the integrated circuit die of the processor includes one or more devices, such as group III-V semiconductor devices having asymmetric source and drain structures built in accordance with implementations of the disclosure. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the disclosure, the integrated circuit die of the communication chip includes one or more devices, such as group III-V semiconductor devices having asymmetric source and drain structures built in accordance with implementations of the disclosure.

In further implementations, another component housed within the computing device 600 may contain an integrated circuit die that includes one or more devices, such as group III-V semiconductor devices having asymmetric source and drain structures built in accordance with implementations of the disclosure.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Figure 7:
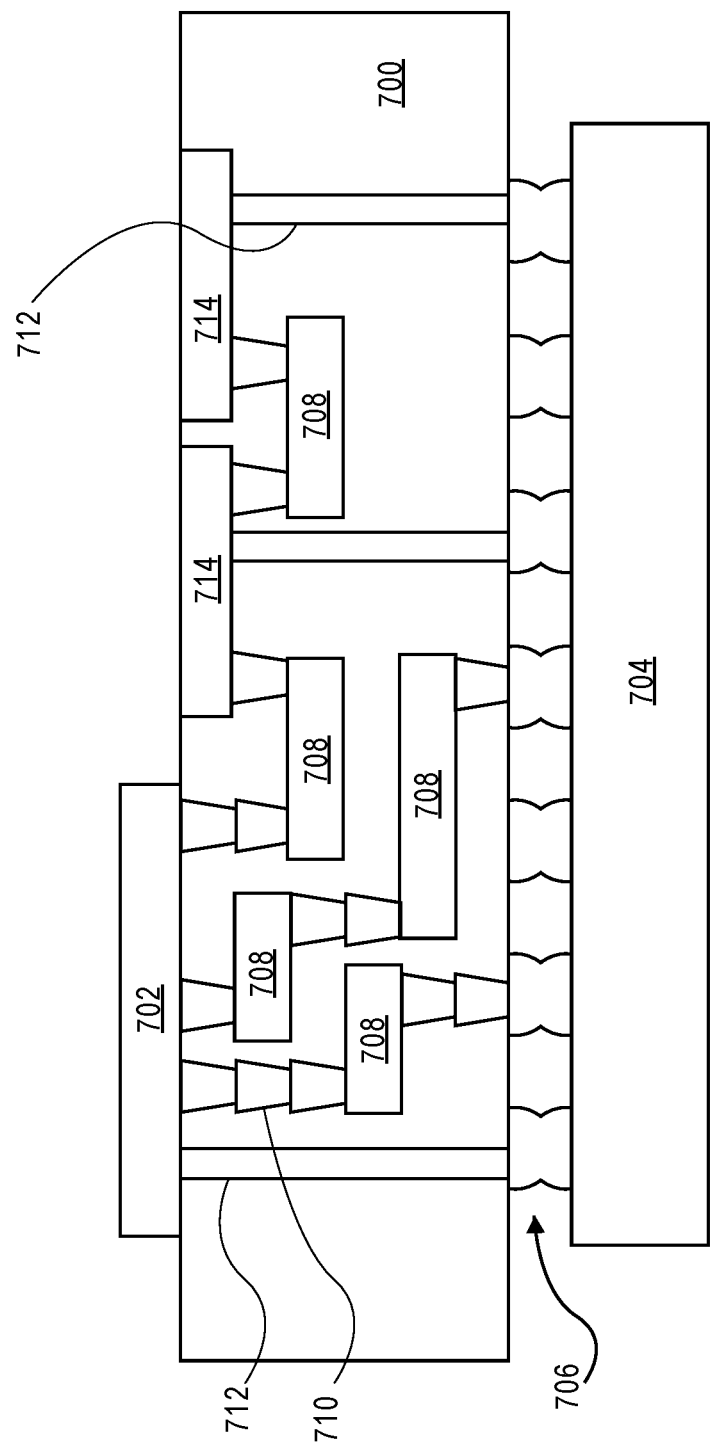
FIG. 7 illustrates an interposer that includes one or more embodiments of the disclosure.

FIG. 7 illustrates an interposer 700 that includes one or more embodiments of the disclosure. The interposer 700 is an intervening substrate used to bridge a first substrate 702 to a second substrate 704. The first substrate 702 may be, for instance, an integrated circuit die. The second substrate 704 may be, for instance, a memory module, a computer motherboard, or another integrated circuit die. Generally, the purpose of an interposer 700 is to spread a connection to a wider pitch or to reroute a connection to a different connection. For example, an interposer 700 may couple an integrated circuit die to a ball grid array (BGA) 706 that can subsequently be coupled to the second substrate 704. In some embodiments, the first and second substrates 702/704 are attached to opposing sides of the interposer 700. In other embodiments, the first and second substrates 702/704 are attached to the same side of the interposer 700. And in further embodiments, three or more substrates are interconnected by way of the interposer 700.

The interposer 700 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 708 and vias 710, including but not limited to through-silicon vias (TSVs) 712. The interposer 700 may further include embedded devices 714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 700. In accordance with embodiments of the disclosure, apparatuses or processes disclosed herein may be used in the fabrication of interposer 700.

Thus, embodiments described herein include group III-V semiconductor devices having asymmetric source and drain structures, and their methods of fabrication.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure includes a gallium arsenide layer on a substrate. A channel structure is on the gallium arsenide layer. The channel structure includes indium, gallium and arsenic. A source structure is at a first end of the channel structure and a drain structure is at a second end of the channel structure. The drain structure has a wider band gap than the source structure. A gate structure is over the channel structure.

Example embodiment 2: The integrated circuit structure of example embodiment 1, wherein the source structure has approximately the same band gap as the channel structure.

Example embodiment 3: The integrated circuit structure of example embodiment 1 or 2, wherein the source structure and the drain structure are doped with N-type dopants.

Example embodiment 4: The integrated circuit structure of example embodiment 3, wherein the concentration of N-type dopants in the drain structure is less than the concentration of N-type dopants in the source structure.

Example embodiment 5: The integrated circuit structure of example embodiment 1, 2, 3 or 4, further including an intrinsic region between the drain structure and the channel structure, the intrinsic region including a same semiconductor material as the drain structure.

Example embodiment 6: The integrated circuit structure of example embodiment 1, 2, 3, 4 or 5, further including a dielectric layer between the channel structure and the gate structure.

Example embodiment 7: The integrated circuit structure of example embodiment 1, 2, 3, 4, 5 or 6, further including a first conductive contact on the drain structure, and a second conductive contact on the source structure.

Example embodiment 8: The integrated circuit structure of example embodiment 1, 2, 3, 4, 5, 6 or 7, wherein the channel structure is a fin structure.

Example embodiment 9: The integrated circuit structure of example embodiment 1, 2, 3, 4, 5, 6 or 7, wherein the channel structure is a nanowire structure.

Example embodiment 10: The integrated circuit structure of example embodiment 1, 2, 3, 4, 5, 6, 7, 8 or 9, wherein the drain structure includes indium phosphide (InP), and the source structure includes indium gallium arsenide (InGaAs) or indium arsenide (InAs).

Example embodiment 11: A method of fabricating an integrated circuit structure includes forming a first semiconductor layer on a gallium arsenide layer above a substrate. A gate structure is formed over the first semiconductor layer. A second side of the gate structure but not a first side of the gate structure is masked with a mask. A portion of the first semiconductor layer is removed at the first side of the gate structure. The mask is removed. A second semiconductor layer is formed at the first side of the gate structure, the second semiconductor layer having a wider band gap than the first semiconductor layer. N-type dopants are implanted to form a drain structure in the second semiconductor layer at the first side of the gate structure and to form a source structure in the first semiconductor layer at the second side of the gate structure.

Example embodiment 12: The method of example embodiment 11, wherein the first semiconductor layer includes indium, gallium and arsenic.

Example embodiment 13: The method of example embodiment 11 or 12, wherein the second semiconductor layer includes indium and phosphorus.

Example embodiment 14: The method of example embodiment 11, 12 or 13, wherein the concentration of N-type dopants in the drain structure is less than the concentration of N-type dopants in the source structure.

Example embodiment 15: The method of example embodiment 11, 12, 13 or 14, further including forming a first conductive contact on the drain structure, and a second conductive contact on the source structure.

Example embodiment 16: A method of fabricating an integrated circuit structure includes forming a first semiconductor layer on a gallium arsenide layer above a substrate. A gate structure is formed over the first semiconductor layer. A first side of the gate structure but not a second side of the gate structure is masked with a mask. A portion of the first semiconductor layer is removed at the second side of the gate structure. The mask is removed. A second semiconductor layer is formed at the second side of the gate structure, the first semiconductor layer having a wider band gap than the second semiconductor layer. N-type dopants are implanted to form a drain structure in the first semiconductor layer at the first side of the gate structure and to form a source structure in the second semiconductor layer at the second side of the gate structure.

Example embodiment 17: The method of example embodiment 16, wherein the second semiconductor layer includes indium, gallium and arsenic.

Example embodiment 18: The method of example embodiment 16 or 17, wherein the first semiconductor layer includes indium and phosphorus.

Example embodiment 19: The method of example embodiment 16, 17 or 18, wherein the concentration of N-type dopants in the drain structure is less than the concentration of N-type dopants in the source structure.

Example embodiment 20: The method of example embodiment 16, 17, 18 or 19, further including forming a first conductive contact on the drain structure, and a second conductive contact on the source structure.

What is claimed is:

1. An integrated circuit structure, comprising:
    a gallium arsenide layer on a substrate;
    a channel structure on the gallium arsenide layer, the channel structure comprising indium, gallium and arsenic;
    a source structure at a first end of the channel structure and a drain structure at a second end of the channel structure, the drain structure having a wider band gap than the source structure, wherein the source structure and the drain structure have a same conductivity type; and
    a gate structure over the channel structure.

2. The integrated circuit structure of claim 1, wherein the source structure has approximately the same band gap as the channel structure.

3. The integrated circuit structure of claim 1, wherein the source structure and the drain structure are doped with N-type dopants.

4. The integrated circuit structure of claim 3, wherein the concentration of N-type dopants in the drain structure is less than the concentration of N-type dopants in the source structure.

5. The integrated circuit structure of claim 1, further comprising:
    an intrinsic region between the drain structure and the channel structure, the intrinsic region comprising a same semiconductor material as the drain structure.

6. The integrated circuit structure of claim 1, further comprising:
    a dielectric layer between the channel structure and the gate structure.

7. The integrated circuit structure of claim 1, further comprising:
    a first conductive contact on the drain structure, and a second conductive contact on the source structure.

8. The integrated circuit structure of claim 1, wherein the channel structure is a fin structure.

9. The integrated circuit structure of claim 1, wherein the channel structure is a nanowire structure.

10. The integrated circuit structure of claim 1, wherein the drain structure comprises indium phosphide (InP), and the source structure comprises indium gallium arsenide (InGaAs) or indium arsenide (InAs).

11. A method of fabricating an integrated circuit structure, the method comprising:
    forming a first semiconductor layer on a gallium arsenide layer above a substrate;
    forming a gate structure over the first semiconductor layer;
    masking a second side of the gate structure but not a first side of the gate structure with a mask;
    removing a portion of the first semiconductor layer at the first side of the gate structure;
    removing the mask;
    forming a second semiconductor layer at the first side of the gate structure, the second semiconductor layer having a wider band gap than the first semiconductor layer; and
    implanting N-type dopants to form a drain structure in the second semiconductor layer at the first side of the gate structure and to form a source structure in the first semiconductor layer at the second side of the gate structure.

12. The method of claim 11, wherein the first semiconductor layer comprises indium, gallium and arsenic.

13. The method of claim 12, wherein the second semiconductor layer comprises indium and phosphorus.

14. The method of claim 11, wherein the concentration of N-type dopants in the drain structure is less than the concentration of N-type dopants in the source structure.

15. The method of claim 11, further comprising:
    forming a first conductive contact on the drain structure, and a second conductive contact on the source structure.

16. A method of fabricating an integrated circuit structure, the method comprising:
    forming a first semiconductor layer on a gallium arsenide layer above a substrate;
    forming a gate structure over the first semiconductor layer;
    masking a first side of the gate structure but not a second side of the gate structure with a mask;
    removing a portion of the first semiconductor layer at the second side of the gate structure;
    removing the mask;
    forming a second semiconductor layer at the second side of the gate structure, the first semiconductor layer having a wider band gap than the second semiconductor layer; and
    implanting N-type dopants to form a drain structure in the first semiconductor layer at the first side of the gate structure and to form a source structure in the second semiconductor layer at the second side of the gate structure.

17. The method of claim 16, wherein the second semiconductor layer comprises indium, gallium and arsenic.

18. The method of claim 17, wherein the first semiconductor layer comprises indium and phosphorus.

19. The method of claim 16, wherein the concentration of N-type dopants in the drain structure is less than the concentration of N-type dopants in the source structure.

20. The method of claim 16, further comprising:
    forming a first conductive contact on the drain structure, and a second conductive contact on the source structure.

* * * * *